(12) United States Patent
Liu et al.

(10) Patent No.: US 8,693,962 B2
(45) Date of Patent: Apr. 8, 2014

(54) ANALOG POWER AMPLIFIER PREDISTORTION METHODS AND APPARATUS

(75) Inventors: Dongtai Liu, Fremont, CA (US); Dali Yang, Mountain View, CA (US); James Anderson, Santa Cruz, CA (US)

(73) Assignee: Dali Systems Co. Ltd., George Town Grand Cayman (KY)

( * ) Notice: Subject to any disclaimer, the term of this patent is extended or adjusted under 35 U.S.C. 154(b) by 384 days.

(21) Appl. No.: 12/203,064

(22) Filed: Sep. 2, 2008

(65) Prior Publication Data
US 2009/0085658 A1  Apr. 2, 2009

Related U.S. Application Data

(60) Provisional application No. 60/969,127, filed on Aug. 30, 2007.

(51) Int. Cl.
*H04B 1/04* (2006.01)

(52) U.S. Cl.
USPC ......... 455/114.3; 330/149; 375/296; 375/297

(58) Field of Classification Search
USPC .......... 455/114.3, 341, 239.1, 91, 127.2, 113, 455/7, 11.1, 13.1, 115.2, 63.1, 126, 522, 455/127.1, 90.1; 330/10, 149, 136, 75, 295, 330/124 R, 285, 286, 106, 107; 375/296–298, 269, 285
See application file for complete search history.

(56) References Cited

U.S. PATENT DOCUMENTS

| | | |
|---|---|---|
| 4,638,248 A | 1/1987 | Schweickert |
| 4,700,151 A | 10/1987 | Nagata |
| 4,890,300 A | 12/1989 | Andrews |
| 4,929,906 A | 5/1990 | Voyce et al. |
| 5,049,832 A | 9/1991 | Cavers |
| 5,121,412 A | 6/1992 | Borth |
| 5,132,639 A | 7/1992 | Blauvelt et al. |
| 5,396,190 A | 3/1995 | Murata |
| 5,486,789 A | 1/1996 | Palandech et al. |
| 5,579,342 A | 11/1996 | Crozier |
| 5,675,287 A | 10/1997 | Baker et al. |
| 5,678,198 A | 10/1997 | Lemson |
| 5,732,333 A | 3/1998 | Cox et al. |
| 5,757,229 A | 5/1998 | Mitzlaff |
| 5,786,728 A | 7/1998 | Alinikula |
| 5,936,464 A | 8/1999 | Grondahl |
| 5,937,011 A | 8/1999 | Carney et al. |
| 5,949,283 A | 9/1999 | Proctor et al. |

(Continued)

*Primary Examiner* — Edward Urban
*Assistant Examiner* — Golam Sorowar
(74) *Attorney, Agent, or Firm* — Kilpatrick Townsend & Stockton LLP

(57) ABSTRACT

An embodiment of the invention is a predistortion approach to linearize a power amplifier by using one or more analog multiplier(s) and a DSP-based processor. For the analog embodiment, the inherent nature of the analog circuitries allows digital predistortion processing structured directly at the RF band, and enables a single power amplifier to support multi-modulation schemes, multi-carriers and multi-channels. As a result, the predistortion architecture is particularly suitable for wireless transmission systems, such as base-stations, repeaters, and indoor signal coverage systems. The wireless system performance can be improved and upgraded just by using the new PA module rather than change or rebuild new subsystem in existing base station. The analog embodiment can also mix and match its analog multipliers with other analog components such as phase splitters, phase shifters, attenuators, filters, couplers, mixers, low-noise amplifiers, buffers, envelope detectors, and etc., to provide additional features.

12 Claims, 5 Drawing Sheets

The Analog Embodiment: Predistortion Architecture with Analog Multiplier

(56) References Cited

U.S. PATENT DOCUMENTS

| | | | |
|---|---|---|---|
| 5,959,499 | A | 9/1999 | Khan et al. |
| 5,963,549 | A | 10/1999 | Perkins et al. |
| 6,054,896 | A | 4/2000 | Wright et al. |
| 6,055,418 | A | 4/2000 | Harris et al. |
| 6,091,941 | A | 7/2000 | Moriyama et al. |
| 6,240,144 | B1 | 5/2001 | Ha |
| 6,242,979 | B1 | 6/2001 | Li |
| 6,246,286 | B1 | 6/2001 | Persson |
| 6,246,865 | B1 | 6/2001 | Lee |
| 6,275,685 | B1 | 8/2001 | Wessel et al. |
| 6,301,579 | B1 | 10/2001 | Becker |
| 6,400,774 | B1 | 6/2002 | Matsuoka et al. |
| 6,424,225 | B1 | 7/2002 | Choi et al. |
| 6,512,417 | B2 | 1/2003 | Booth et al. |
| 6,552,634 | B1 | 4/2003 | Raab |
| 6,625,429 | B1 | 9/2003 | Yamashita |
| 6,639,050 | B1 | 10/2003 | Kieliszewski |
| 6,677,870 | B2 | 1/2004 | Im et al. |
| 6,697,436 | B1 | 2/2004 | Wright et al. |
| 6,703,897 | B2 | 3/2004 | O'Falherty et al. |
| 6,731,904 | B1 * | 5/2004 | Judd ............... 455/11.1 |
| 6,741,663 | B1 | 5/2004 | Tapio et al. |
| 6,747,649 | B1 | 6/2004 | San-z Pastor et al. |
| 6,751,447 | B1 | 6/2004 | Jin et al. |
| 6,963,242 | B2 | 11/2005 | White et al. |
| 6,983,025 | B2 | 1/2006 | Schell |
| 6,985,704 | B2 | 1/2006 | Yang et al. |
| 7,035,345 | B2 | 4/2006 | Jeckeln et al. |
| 7,042,287 | B2 | 5/2006 | Robinson |
| 7,061,314 | B2 | 6/2006 | Kwon et al. |
| 7,064,606 | B2 | 6/2006 | Louis |
| 7,079,818 | B2 | 7/2006 | Khorram |
| 7,102,442 | B2 | 9/2006 | Anderson |
| 7,103,329 | B1 | 9/2006 | Thon |
| 7,104,310 | B2 | 9/2006 | Hunter |
| 7,106,806 | B1 | 9/2006 | Kenington |
| 7,109,792 | B2 | 9/2006 | Leffel |
| 7,109,998 | B2 | 9/2006 | Smith |
| 7,151,913 | B2 * | 12/2006 | Ahmed ............... 455/91 |
| 7,158,765 | B2 | 1/2007 | Blair et al. |
| 7,193,472 | B2 | 3/2007 | Gotou et al. |
| 7,248,642 | B1 | 7/2007 | Vella-Coleiro |
| 7,259,630 | B2 | 8/2007 | Bachman et al. |
| 7,295,819 | B2 * | 11/2007 | Kenington et al. ........ 455/127.2 |
| 7,321,635 | B2 | 1/2008 | Ocenasek et al. |
| 7,321,636 | B2 | 1/2008 | Harel et al. |
| 7,372,918 | B2 | 5/2008 | Muller et al. |
| 7,469,491 | B2 | 12/2008 | McCallister et al. |
| 7,831,221 | B2 | 11/2010 | Leffel et al. |
| RE42,287 | E | 4/2011 | Apodaca et al. |
| 2002/0034260 | A1 | 3/2002 | Kim |
| 2002/0044014 | A1 | 4/2002 | Wright et al. |
| 2002/0080891 | A1 | 6/2002 | Ahn et al. |
| 2002/0101937 | A1 | 8/2002 | Antonio et al. |
| 2002/0101938 | A1 | 8/2002 | Horaguchi et al. |
| 2002/0186783 | A1 | 12/2002 | Opas et al. |
| 2002/0187761 | A1 | 12/2002 | Im et al. |
| 2002/0193085 | A1 | 12/2002 | Mathe et al. |
| 2003/0095608 | A1 | 5/2003 | Duperray |
| 2003/0179829 | A1 | 9/2003 | Pinckley et al. |
| 2003/0179830 | A1 | 9/2003 | Eidson et al. |
| 2003/0207680 | A1 * | 11/2003 | Yang et al. ............... 455/341 |
| 2004/0017859 | A1 | 1/2004 | Sills et al. |
| 2004/0240585 | A1 | 12/2004 | Bishop et al. |
| 2005/0079834 | A1 | 4/2005 | Maniwa et al. |
| 2005/0159117 | A1 | 7/2005 | Bausov et al. |
| 2005/0262498 | A1 | 11/2005 | Ferguson et al. |
| 2006/0012426 | A1 | 1/2006 | Nezami |
| 2006/0217083 | A1 * | 9/2006 | Braithwaite ............... 455/114.3 |
| 2006/0270366 | A1 | 11/2006 | Rozenblit et al. |
| 2007/0075780 | A1 | 4/2007 | Krvavac et al. |
| 2007/0171234 | A1 | 7/2007 | Crawfis et al. |
| 2007/0241812 | A1 | 10/2007 | Yang et al. |

\* cited by examiner

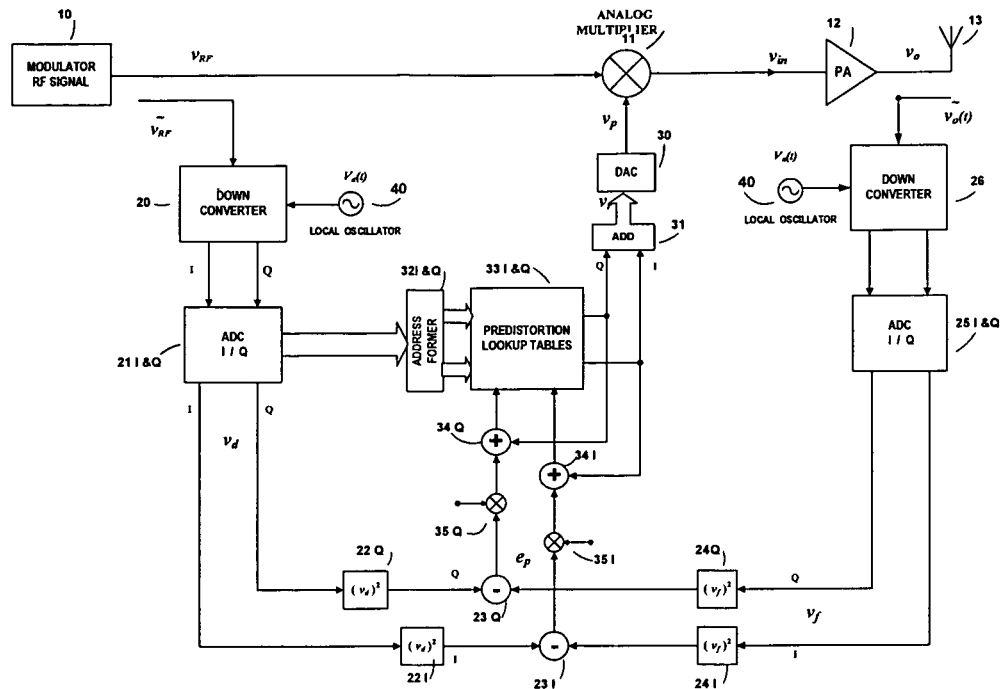
FIG. 1. The Analog Embodiment: Predistortion Architecture with Analog Multiplier
FIG. 2. The input-output relation of Analog Multiplier
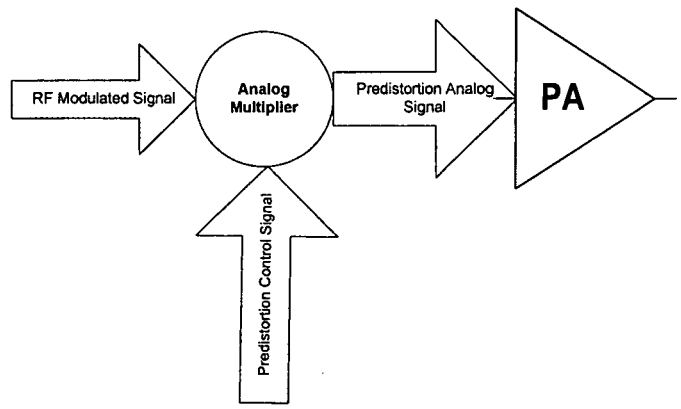

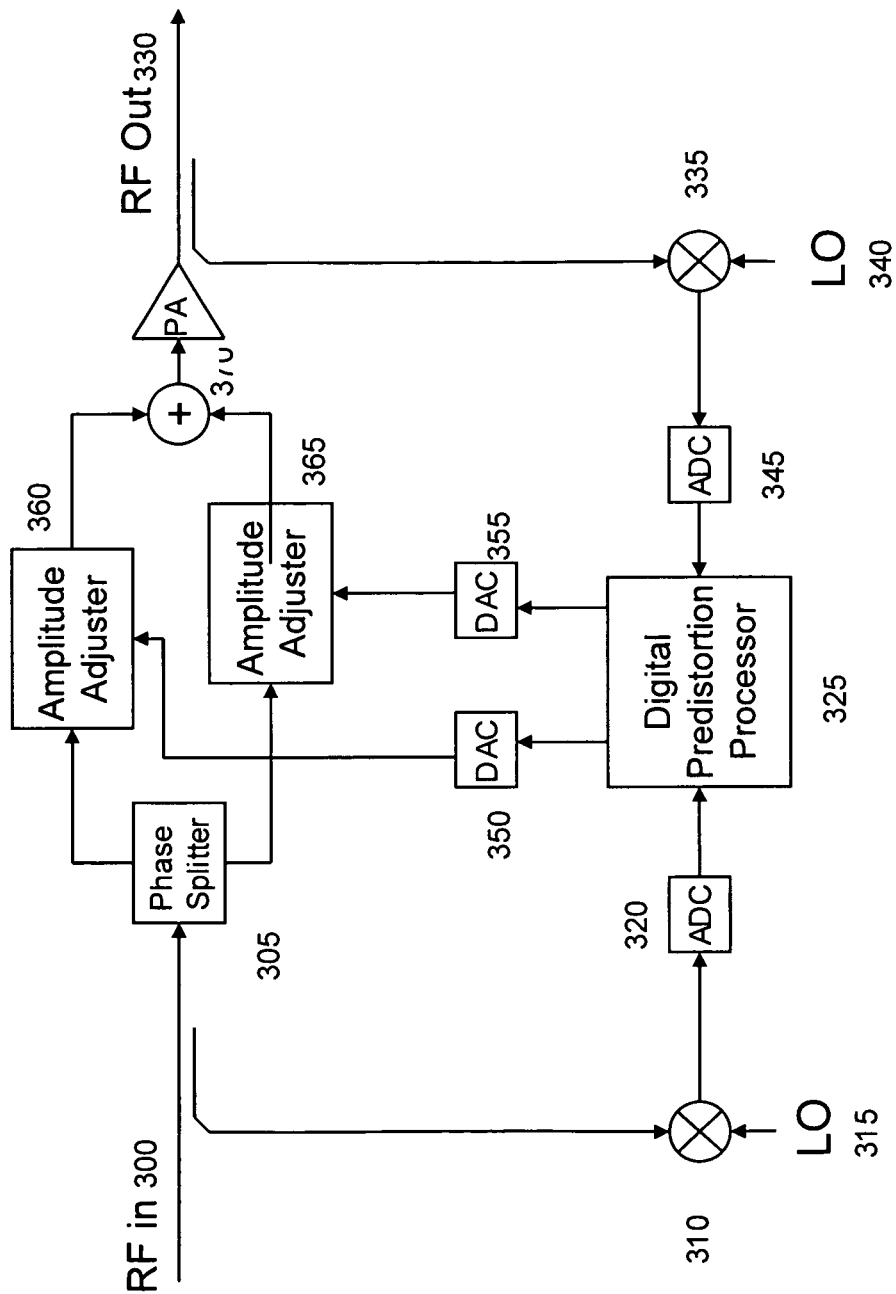
Figure 3 - RF I-Q based DPD Architecture

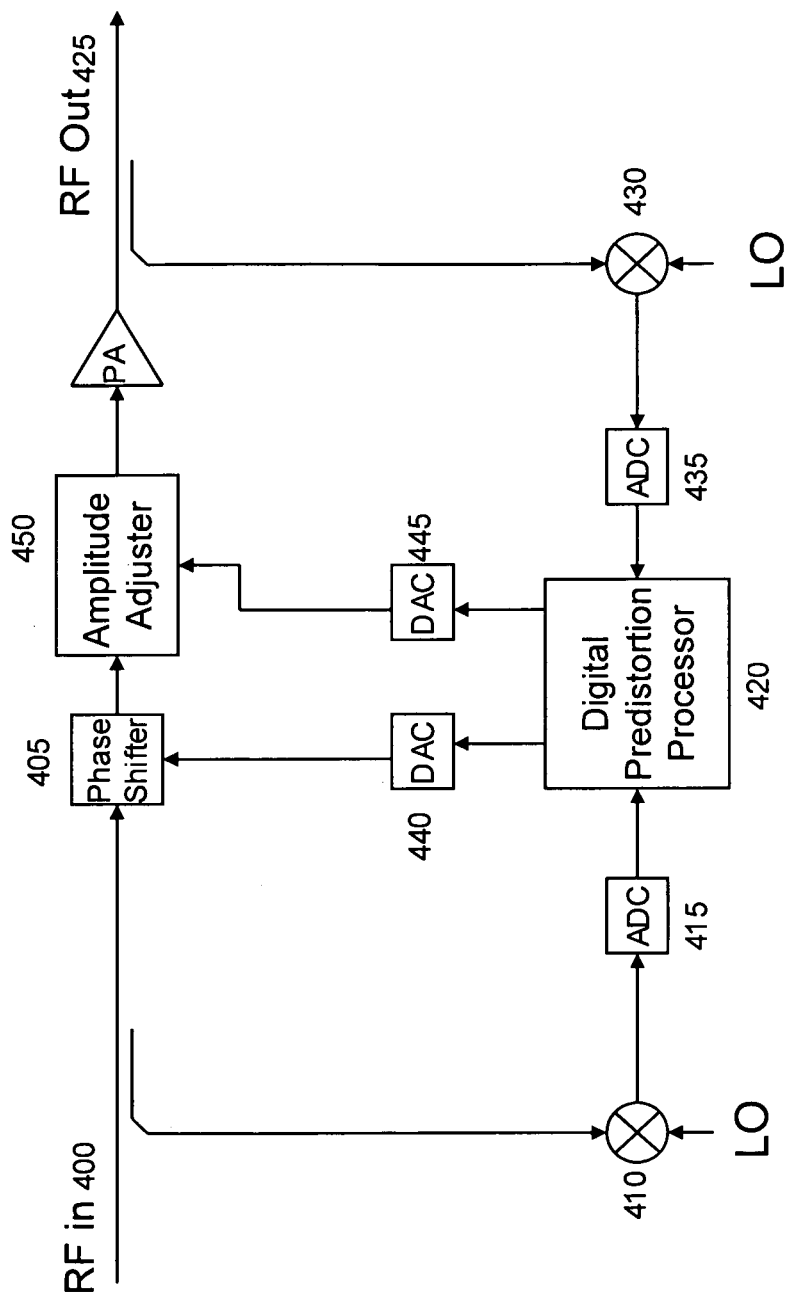
Figure 4 - RF P-M based DPD Architecture

ANALOG POWER AMPLIFIER PREDISTORTION METHODS AND APPARATUS

CROSS REFERENCE TO RELATED APPLICATIONS

This application claims the benefit of U.S. Provisional Patent Application No. 60/969,127, filed Aug. 30, 2007, which is hereby incorporated by reference for all purposes.

BACKGROUND OF THE INVENTION

The current and next-generation wireless communication systems will utilize improved PA efficiency technology for a variety of broadband and multimedia services, supported by the advanced wireless RF transmitter, in which the linear and high-efficient high power amplifier will improve the transmitted quality, system performance and cost saving. Traditional predistortion technologies and schemes used widely to linearize PA in wireless communication systems are (i) analog feed-forward linearizers implemented in RF band by means of analog hardware circuit, and (ii) digital predistortion schemes in the baseband that involve a feedback channel and driven by digital signal processing (DSP) algorithms and integrated circuits.

Conventional analog predistortion schemes are mainly based on the principle of error subtraction and power-matching with dedicated hardware circuitries to realize non-linear corrections to PA. These approaches must use an auxiliary PA and complicated hardware circuitries to match exactly the transmitted power-balance, time-delay and errors generated by the main PA. After a perfect matching is obtained, the non-linear distortion errors from the main PA can then be canceled by those distortion errors from the auxiliary PA. Due to the complexities of the nonlinear predistortion circuits, which among other things involve many variables and parameters, the analog schemes require significant fine tuning and other calibration efforts. In addition, such traditional analog schemes are also vulnerable to fluctuating environmental conditions, such as temperature and humidity changes, since perfect alignments of the main PA's signal and that of the auxiliary PA are vital. As a result, traditional predistortion schemes are costly to implement and are limited in their predistortion accuracy and stability in commercialized wireless system environment.

Conventional DSP-based digital predistortion schemes utilize digital microprocessors to compute, calculate and correct PA's nonlinearities: they perform fast tracking and adjustments of signals in the PA system. Since the computations are performed in the digital domain, such digital schemes can also accommodate a wider fluctuations of environmental conditions, and reduce the extent of fine-tuning or calibrations during the manufacturing stage. However, traditional digital predistortion schemes necessitate coded in-phase (I) and quadrature (Q) channel signals in the baseband as the required ideal or reference signals. As a result, the feedback signal from PA output must be down-converted to baseband area by the arrangement of down-converting and demodulation circuitries. Therefore, in order to deploy traditional digital predistortion schemes into base-stations, the digital predistortion engines must be embedded into the baseband architecture of base-stations. This embedment is a practical implementation challenge since it is frequently inconvenient or impossible to modify the baseband architectures of existing base-stations or base-station designs. Furthermore, since traditional digital predistortion approaches require baseband I-Q signal sources to operate, they are inapplicable to certain RF systems that do not possess any baseband I-Q signal sources, such as repeater and indoor signal coverage subsystems.

SUMMARY OF THE INVENTION

The present disclosure teaches an approach to linearize the output of a power amplifier (PA), such as those used in wireless base stations for communications networks, using one or more analog multipliers (the "Analog Embodiment"). The disclosed approach is especially applicable to all wireless radio frequency (RF) transmitter systems and improves both the power efficiency and linearity of wireless transmission systems. Applications of the present invention are suitable for use with all wireless base-stations, access points, mobile equipment and wireless terminals, portable wireless devices, and other wireless communication systems such as microwave and satellite communications. Various alternative embodiments are disclosed.

The first of the present inventions relates to a predistortion method to linearize a power amplifier (PA) by using one or more analog multipliers together with an adaptive predistortion algorithm implemented in a processor, such as a DSP-based processor or similar device, to yield a PA output with high linearity and high power efficiency. The use of analog multipliers permit the predistortion to be performed at the RF band, rather than being down-converted and then upconverted, which in turn allow a single PA to continue to support, without internal modification, the multiple modulation schemes typically managed by a modern PA. The following Detailed Description of the invention may be better understood when taken in conjunction with the appended Figures, described below.

THE FIGURES

FIG. 1 illustrates in schematic diagram form a predistortion architecture with analog multiplier in accordance with the present invention.

FIG. 2 illustrates in simplified schematic form the input-output relation of analog multiplier of FIG. 1.

FIG. 3 illustrates in schematic diagram form an RF I-Q-based DPD Architecture.

FIG. 4 illustrates in schematic diagram form an RF P-M based DPD Architecture.

DETAILED DESCRIPTION OF THE INVENTION

Figure 5A:
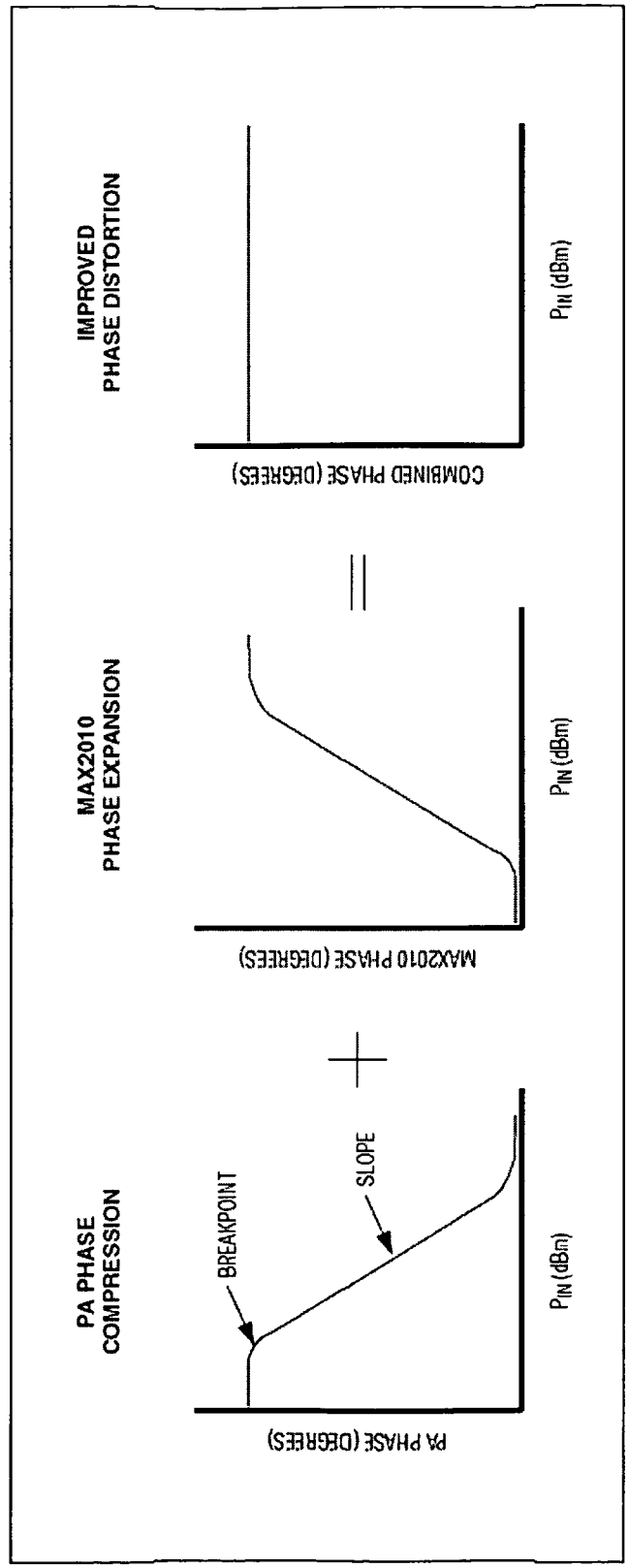
FIGS. 5A and 5B illustrate PA phase compression and cancellation, and PA gain compression and cancellation, respectively, in an RF P-M-based DPD architecture.

On a general level, the analog approach of the present invention approach comprises one or more analog multipliers to combine RF modulated signal $v_{RF}(t)$ and predistortion control signal $v_p(t)$ (hereinafter as "RF Modulated Signal" and "Predistortion Control Signal" respectively). Although these devices can be implemented as multipliers in many embodiments, in general they are better thought of as amplitude adjusters. In some embodiments, they also can be referred to as gain adjusters.

The Predistortion Control Signal $v_p(t)$ from the DSP control board is adaptively generated, based on the comparison of the RF Modulated Signal—the ideal input signal from the modulator—and the feedback signal $v_o(t)$ from the PA's output (sometimes referred to hereinafter as the "Feedback Signal"). This permits the predistortion architecture of the present invention to quickly track and compensate for the non-linear characteristics of PA in real-time.

The Analog Embodiment can have one or multiple analog multipliers, and can also mix and match with other analog components such as phase splitters, phase shifters, attenuators, filters, couplers, mixers, low-noise amplifiers, buffers, envelope detectors, and etc., to provide additional controls, features and functionalities.

In an embodiment, the Predistortion Control Signal from the DSP controller is a single analog signal without the requirement of I and Q signals. Such Predistortion Control Signal is first generated by an adaptive calculation in the DSP processor as a baseband signal and then converted to the analog version by a digital-to-analog converter (DAC). All non-linear predistortion correction calculations in this architecture are completed by digital signal processing; hence, our Analog Embodiment is an implementation of digital predistortion in RF band. By using this approach, the predistortion system does not need the original I and Q digital signals, which are typically required by traditional digital predistortion architectures. The predistortion system simply processes the RF signal directly from the modulator of a base-station system—the RF Modulated Signal—and the feedback signal from the PA's output—the Feedback Signal. At first, the two RF signals feeding into the predistortion system are down-converted by analog circuits to a lower frequency for further analog-to-digital converter (ADC) processing. Then, the digitized signals are processed in the DSP processor by an adaptive algorithm, presented in U.S. Pat. No. 6,985,704, to track, calculate and correct the non-linear distortions of the PA.

The embodiment of the analog approach shown in FIG. 1 comprises four fundamental functions, as follows:

the RF Modulated Signal from input source and the Feedback Signal from PA output are down-converted, respectively, by analog devices, such as mixers.

the analog intermediate frequency (IF) signals are digitized after the ADCs for digital predistortion correction processing;

an adaptive algorithm operates in the DSP processor and the result is a digital predistortion control signal $v_r(t)$ (hereinafter as "D-P Control Signal"). Such digital output signal is converted to an analog signal by a DAC, which becomes the Predistortion Control Signal, and such Predistortion Control Signal is then fed to at least one analog multiplier to operate;

the RF Modulated Signal and Predistortion Control Signal are mixed or multiplied in the analog multiplier(s), and the output is a predistorted analog signal $v_{in}(t)$ (the "Predistortion Analog Signal") which is then fed to PA for wireless transmission.

These general functions can be better appreciated from FIGS. 1 and 2, in which an RF Signal Modulator 10 provides the RF Modulated Signal $v_{RF}(t)$ to an analog multiplier 11, which may comprise one or more such multipliers. The RF Modulated Signal $v_{RF}(t)$ is combined in the analog multiplier 11 with the Predistortion Control Signal $v_p(t)$ as described in greater detail hereinafter, and the output of the multiplier provides the input to a PA 12. The result is that the output, $v_o$, of the PA is linearized for transmission over antenna 13. The RF modulator 10 is typically although not necessarily a quadrature modulator or an orthogonal modulator. It will be appreciated that multiplier 11 can be implemented as multiple multipliers, each associated with one or more quadrature signals.

An input down-converter circuit 20 receives an idealized reference RF Modulated Signal $v_{RF}$ from modulator in base station, and is biased by a local oscillator 40, such that it provides an output $v_d$ to an analog-to-digital converter 21. The ADC 21 converts the signal $v_d$ to digital form, whereupon it is provided as one input to a Digital Predistortion Processor (DPP) 200, which can be configured as shown in the attached exhibits and typically comprises a digital signal processor with lookup table implementing the algorithm disclosed in related application Ser. No. 11/262,079, attached.

A feedback down-converter circuit 26, also biased by a local oscillator 40, receives a raw Feedback Signal $v_o(t)$ from the output of the PA, and provides a feedback signal $V_f$ to an feedback ADC 25. The digital output of the ADC 25 then provides a second input, i.e. feedback signal, to the Digital Predistortion Processor 200. The Digital Predistortion Processor 200, discussed in greater detail below, provides a digital output signal $v_r$, the D-P Control Signal, to a DAC 30, which converts the digital signal to an analog form, where it is combined with the RF Modulated in the multiplier 11.

As shown in FIG. 1, address data formers 32I-32Q receive inputs from the ADC 21I/Q, and are designed to generate the required signal format for a lookup table 33I/Q. The data formers 32I/Q address memory units within the lookup tables 33I/Q, where the lookup table provides separate I and Q outputs to an adder 31. It will be appreciated that the lookup table 33 can be implemented as one or more lookup tables. The address provided by the address formers 32I-32Q can be considered a lookup-table key or address.

The predistortion controller lookup tables 33I-33Q are memory units designed to store the predistortion signal for high power amplifier linearization. The predistortion signals in the tables are based on the error generated by a comparison of the ideal signal $v_d$ and the feedback signal $v_f$ and the presented adaptive algorithm. The data stored in the tables 33I-Q can be updated by adaptive iteration as described hereinafter, and form digitally indexed data reflecting the nonlinear characteristics of the power amplifier.

By comparison of AM-AM and AM-PM information between the idealized RF Modulated Signal $v_{RF}(t)$ and the Feedback Signal $v_o(t)$, the Digital Predistortion Processor calculates the error in the amplitude and phase components of the output signal $v_o(t)$ caused by the non-linear transmission characteristics of the high power amplifier 12.

Based on the error information obtained by the foregoing comparison, the predistortion processor, based on the lookup table algorithm disclosed in U.S. Pat. No. 6,985,704 [attached hereto at Appendix 1], calculates and generates adaptively a compensation signal that is of inverse characteristics with the transform function of the PA 12 to pre-distort the AM-AM and AM-PM distortion caused by the PA 12.

The outputs $v_p$, the Predistortion Control Signal, of the predistortion lookup table 33I-33Q are fed to multiplier 11, after an adder 31 and a digital-to-analog converter 30, to modify the RF Modulated Signal from modulator 10. The output of the multiplier is the required Predistortion Analog Signal $v_{in}(k)$ that is of an inverse non-linearity with that of the power amplifier 12 to yield a pre-compensation to the input of high power amplifier.

It will be appreciated by those skilled in the art that there can be a signal difference between two signals, ideal RF Modulated Signal $v_{RF}$ and Feedback Signal, $v_o(t)$, when they arrive at predistortion controller of FIG. 1. The time difference results from the time-delay differences between the two signals, which is caused by the different paths each travels in arriving at the processor 200. This signal time-delay can vary randomly based on the parameters of the circuits and parts, as well as other environmental factors. The result is that it is difficult to estimate, calculate and adjust for such signal differences in the field application environment. To overcome this issue, the present invention adaptively adjusts for this time-delay through the use of an algorithm taught by the previously cited U.S. Pat. No. 6,985,704.

The use of the look-up tables 33 permits a memory function to be introduced into at least some embodiments of the present invention. The lookup table of the predistortion controller 5 is based on a stored compensation principle that maps a set of input data into a digital output, and updated adaptively. Based on the stored function, each output signal of lookup table is actually related to both the current and the previously transmitted signal, and therefore has a memory function which compensate not only for the non-linearity of the PA, but also avoids the need for a special time-delay compensation circuit such as typically used in the prior art. See particularly U.S. Prov. Pat. Appn. Ser. No. 60/898,312, filed Jan. 29, 2007, entitled Power Amplifier Time-delay Invariant Predistortion Methods and Apparatus.

As shown in FIG. 2, an analog multiplier combines and mixes two input signals, the RF Modulated Signal and the Predistortion Control Signal, to generate an output Predistortion Analog Signal that is predistorted and with the corrected components for the AM-AM and AM-PM distortion of PA. The generated Predistortion Analog Signal changes the envelope amplitude and phase characteristics of the original RF Modulated Signal, i.e. predistortion, according to PA's non-linearities but maintains all other original information in the RF Modulated Signal. The Predistortion Analog Signal with the predistorted AM-AM and AM-PM has the characteristic of being the inverse characteristics of the non-linear PA output, and therefore causes the RF transmitter system to exhibit substantially linear transmission performance for the wireless modulated signals.

Referring next to FIG. 3, an alternative embodiment of the present invention which uses multiple analog multipliers can be better appreciated. In particular, the RF Modulated Signal 300 is provided to a phase splitter 305 which typically splits the RF signal into two phases, typically quadrature. The RF modulated signal 300 is also coupled to a multiplier 310 with a low-pass signal 315 to provide an input to ADC 320. The resulting signal provides an input to a digital predistortion processor (DPP) 325, such as described in the applications attached hereto as Exhibits. At the same time, the RF output 330 is also coupled through a multiplier 335 modulated with a low pass signal 340 into an ADC 345, which provides a second input to the DPP 325.

The DPP 325 provides a correction characteristic in response to the signals from the ADC's 320 and 345 that is broken into factors appropriate to each phase, and outputs that correction characteristics appropriate for each phase to respective DAC's 350 and 355. Each of the DAC's 350 and 355 then output their respective signal to associated amplitude adjusters 360 and 365, where they are combined with the inputs from the phase splitter 305. The quadrature components are then reassembled at adder 370 to yield the predistorted output signal. With such an approach, it will be appreciated by those skilled in the art that no baseband signals are needed. The RF signal is essentially split into phase-orthogonal components which are independently controlled by two signal processors, then summed to yield one corrected RF signal. An embodiment of such an arrangement can achieve 360° phase shift and greater than 20 dB magnitude control. These benefits enable higher precision, which in turn yields faster convergence and greater stability.

Figure 5B:
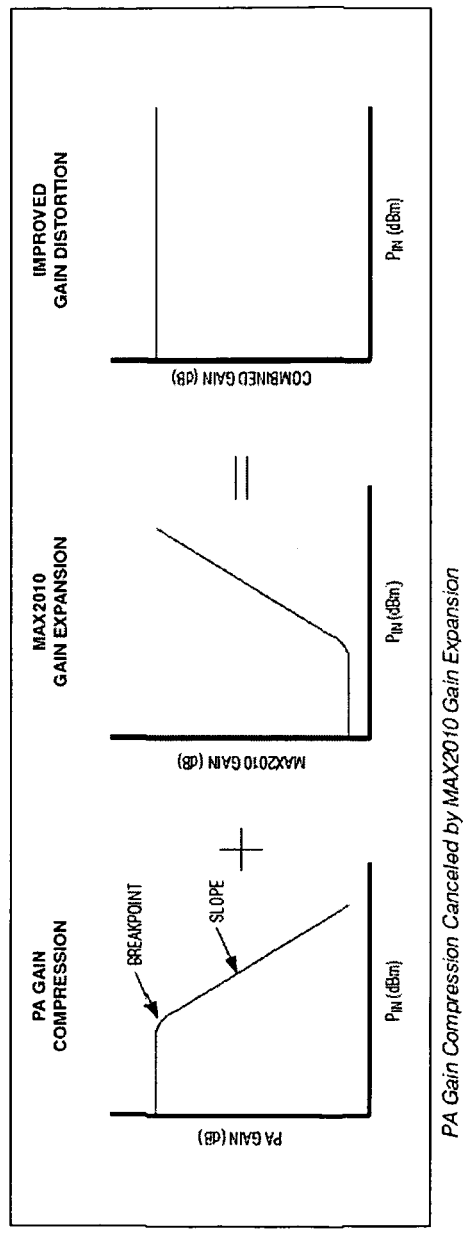

Referring next to FIG. 4, a further alternative embodiment can be better appreciated wherein predistortion correction is provided by phase modulation. In this arrangement, the RF input signal 400 is provided to a phase shifter 405. The RF input signal 400 is also coupled through a low pass filter 410 and ADC 415 to a Digital Predistortion Processor 420. The output RF signal 425 is also coupled through modulator 430 and ADC 435 to DPP 420, which provides predistortion correction information in accordance with the teachings shown in the Exhibits. The DPP 420 outputs a phase correction factor and an amplitude correction factor, with each correction factor going to associated DAC's 440 and 445. The phase correction factor is then supplied to the phase shifter 405, and the amplitude correction factor is supplied to the amplitude adjuster 450, to yield the signal provided to the PA (not shown), the output of which is the RF output signal 425. FIGS. 5A-5B show an example of the cancellation of phase and gain compression achieved through the use of the present invention. An embodiment according to this alternative requires no baseband signals, and the RF is serially processed with a phase shifter and a magnitude adjuster. One implementation of this alternate embodiment yields on the order of 100° phase shift and greater than 20 dB magnitude control. In addition, this approach permits phase-magnitude processing through the analog section and the DPP, which may be implemented as a DSP processor and lookup table resulting in a reduction in processing power.

As mentioned earlier, the Analog Embodiment is capable of allowing a single PA to support multi-modulation schemes, multi-carriers and multi-channels. Since the RF Modulated signal can pass through the multiplier as an analog signal, a single path is sufficient to support such multi-modulation schemes. In addition, while the entries in the lookup table which forms part of the DPP 200 may be in a variety of forms, in at least some embodiments the entries will be stored in terms of polar coordinates to reduce table size and system efficiency.

It will be appreciated by those skilled in the art, in light of the foregoing embodiments and teachings, that numerous other alternatives and embodiments that do not depart from the invention will be apparent to those skilled in the art. As a result, the invention is not intended to be limited by the foregoing description, but only by the appended claims.

We claim:

1. A predistortion architecture for linearizing an output of a power amplifier for wireless transmission systems, the predistortion architecture comprising:
   an RF input adapted to receive multi-channel RF input signals using multiple modulation schemes;
   a first down converter coupled to the RF input and configured to produce a first analog signal representative of the RF input signals;
   a first analog-to-digital converter for converting the first analog signal into a first digital signal;
   a DSP-based processor logic for generating at least one digital correction signal derived from the RF input signals;
   at least one digital-to-analog converter for converting the at least one digital correction signal into at least one analog correction signal;
   an analog multiplier for combining, in an RF band, the RF input signals and the at least one analog correction signal to form a predistorted signal; and
   an output for providing to a power amplifier the predistorted signal configured to substantially linearize the output of the power amplifier;
   a second down converter coupled to the output of the power amplifier, the second down converter configured to produce a second analog signal representative of the output of the power amplifier; and a second analog-to-digital converter for converting the second analog signal into a second digital signal, wherein the DSP-based processor logic comprises:
   an error logic configured to determine an error between the first digital signal and the second digital signal;
   an address former configured to generate a lookup-table key based on the first digital signal; and
   at least one lookup table configured to generate the at least one digital correction signal based on the lookup-table key and the error between the first digital signal and the second digital signal.

2. The predistortion architecture of claim 1 wherein the wireless transmission systems comprise a base-station.

3. The predistortion architecture of claim 1 wherein the wireless transmission systems comprise a repeater.

4. The predistortion architecture of claim 1 wherein the wireless transmission systems comprise an indoor signal coverage system.

5. A predistortion architecture for linearizing an output of a power amplifier for wireless transmission systems, the predistortion architecture comprising:
   an RF input adapted to receive multi-channel RF input signals using multiple modulation schemes;
   a first down converter coupled to the RF input;
   a DSP-based processor logic for generating at least one digital correction signal derived from the RF input signals;
   at least one digital-to-analog converter for converting the at least one digital correction signal into at least one analog correction signal;
   an analog multiplier for combining, in an RF band, the RF input signals and the at least one analog correction signal to form a predistorted signal; and
   an output for providing to a power amplifier the predistorted signal configured to substantially linearize the output of the power amplifier,
   wherein the analog multiplier comprises:
      a phase splitter configured to split the RF input signals into a plurality of phase-split input signals;
      a plurality of amplitude adjusters; and
      an adder;
   wherein:
      the at least one digital correction signal comprises a plurality of digital correction signals;
      the at least one analog correction signal comprises a plurality of analog correction signals;
      the at least one digital-to-analog converter comprises a plurality of digital-to-analog converters, each digital-to-analog converter configured to convert a respective digital correction signal into a corresponding analog correction signal;
      each amplitude adjuster is configured to combine a respective phase-split input signal and a respective analog correction signal to form a respective predistorted phase-split signal; and
      the adder is configured to combine the plurality of predistorted phase-split signals to form the predistorted signal.

6. The predistortion architecture of claim 5 wherein the wireless transmission systems comprise a base-station.

7. The predistortion architecture of claim 5 wherein the wireless transmission systems comprise a repeater.

8. The predistortion architecture of claim 5 wherein the wireless transmission systems comprise an indoor signal coverage system.

9. A predistortion architecture for linearizing an output of a power amplifier for wireless transmission systems, the predistortion architecture comprising:
   an RF input adapted to receive multi-channel RF input signals using multiple modulation schemes;
   a first down converter coupled to the RF input;
   a DSP-based processor logic for generating at least one digital correction signal derived from the RF input signals;
   at least one digital-to-analog converter for converting the at least one digital correction signal into at least one analog correction signal;
   an analog multiplier for combining, in an RF band, the RF input signals and the at least one analog correction signal to form a predistorted signal; and
   an output for providing to a power amplifier the predistorted signal configured to substantially linearize the output of the power amplifier,
   wherein the analog multiplier comprises:
   a phase shifter coupled to the RF input; and
   an amplitude adjuster coupled to the phase shifter;
   wherein:
      the at least one digital correction signal comprises a digital phase correction signal and a digital amplitude correction signal;
      the at least one analog correction signal comprises an analog phase correction signal and an analog amplitude correction signal;
      the at least one digital-to-analog converter comprises a first digital-to-analog converter and a second digital-to-analog converter, the first digital-to-analog converter configured to convert the digital phase correction signal into the analog phase correction signal, the second digital-to-analog converter configured to convert the digital amplitude correction signal into the analog amplitude correction signal;
      the phase shifter is configured to combine the RF input signals and the analog phase correction signal to form a phase-shifted signal; and
      the amplitude adjuster is configured to combine the phase-shifted signal and the analog amplitude correction signal to form the predistorted signal.

10. The predistortion architecture of claim 9 wherein the wireless transmission systems comprise a base-station.

11. The predistortion architecture of claim 9 wherein the wireless transmission systems comprise a repeater.

12. The predistortion architecture of claim 9 wherein the wireless transmission systems comprise an indoor signal coverage system.

* * * * *